United States Patent [19]

Schairer

[11] Patent Number: 5,736,782
[45] Date of Patent: Apr. 7, 1998

[54] CHIP CARD WITH INTEGRATED IR TRANSCEIVER

[75] Inventor: Werner Schairer, Weinsberg, Germany

[73] Assignee: TEMIC Telefunken microelectronic GmbH, Heilbronn, Germany

[21] Appl. No.: 662,367

[22] Filed: Jun. 12, 1996

[30] Foreign Application Priority Data

Jun. 30, 1995 [DE] Germany ............ 195 23 916.4

[51] Int. Cl.⁶ .................... H01L 23/02; G06K 19/06; G06K 7/10; H05K 7/00
[52] U.S. Cl. ............ 257/679; 361/737; 235/492; 235/472
[58] Field of Search ............ 257/679; 235/492, 235/472; 361/737

[56] References Cited

U.S. PATENT DOCUMENTS

| | | | |
|---|---|---|---|
| 5,061,845 | 10/1991 | Pinnavaia | 235/492 |
| 5,242,310 | 9/1993 | Leung | 439/76 |
| 5,247,380 | 9/1993 | Lee et al. | 359/118 |
| 5,343,319 | 8/1994 | Moore | 359/152 |
| 5,373,149 | 12/1994 | Ramussen | 235/492 |
| 5,493,477 | 2/1996 | Hirai | 257/679 |
| 5,619,396 | 4/1997 | Gee et al. | 361/737 |

FOREIGN PATENT DOCUMENTS

| | | |
|---|---|---|
| 0590797 | 4/1994 | European Pat. Off. |
| 4017420 | 11/1991 | Germany . |
| 4021199 | 12/1991 | Germany . |
| 4028966 | 3/1992 | Germany . |

OTHER PUBLICATIONS

"Webster's" New Riverside University Dictionary.
"Der PC schluckt Kreditkart". In: TR Transfer, No. 49, 1993, pp. 18, 19.
"Communication Unit Attachment Mechanism with Attached Mode Detect". In: IBM Technical Disclosure Bulletin, vol. 38, No. 01, Jan. 1995, p. 209.

*Primary Examiner*—Mahshid D. Saadat
*Assistant Examiner*—Jhihan B. Clark
*Attorney, Agent, or Firm*—Spencer & Frank

[57] ABSTRACT

Chip card, in particular a PCMCIA card, complete with a transceiver component for infrared data transmission, where the IR transceiver component is completely integrated into a standard connector and the external structural components—in particular the dimensions of the chip card, connector, and printed circuit board—are not altered.

11 Claims, 1 Drawing Sheet

CHIP CARD WITH INTEGRATED IR TRANSCEIVER

BACKGROUND OF THE INVENTION

1. Field of the Invention

The invention concerns chip cards featuring a housing comprised of top side and underside, an internal chip connector, an external chip connector for connecting peripheral devices, consisting of a connector body which locks into the top side and underside of the chip card, as well as an external function surface complete with appropriate contact elements and an internal function surface provided with contact elements, and an infrared transceiver component for optical data transmission.

2. Description of the Related Art

Chip cards, i.e., input/output (I/O) cards; have been standardised by the Personal Computer Memory Card International Association in the form of the "PC Card Standard", Release 2.0, U.S.A., September 1991, including the "Socket Services Interface Specification", Release 1.01, September 1991, for connectors.

Chip cards which were initially designed for expanding the memory capacity of computers, in particular laptops, are known from U.S. Pat. No. 5,061,845.

In addition, the PCMCIA computer interface is also used to transmit data to peripheral devices, e.g., fax/modem devices, other PCs, printers, and other similar devices, by means of inserting an electronic coupling device into the chip card housing. Due to their functionality and in order to differentiate them from chip memory cards, these cards are designated as chip expansion cards. Thus, chip expansion cards do not only have a PC-end socket but feature also an external socket for connecting peripheral devices or other PCs.

Furthermore, wireless data transmission is also known, e.g. as effected by means of infrared transceiver components, as described in U.S. Pat. No. 5,247,380. U.S. Pat. No. 5,343,319 describes a device for adapting an electric communication socket by means of an optical infared transceiver component, highlighting the particular significance of the PCMCIA interface.

SUMMARY OF THE INVENTION

The object of the invention is to provide a transceiver component for IR data transmission as simply as possible with a coupling link to a chip card interface, preferably the PCMCIA interface.

According to the invention, the object of the invention is achieved by integrating the transceiver component into the connector or termination of the chip card.

This avoids components protruding from the PC housing as it is possible to introduce the chip card completely into the bay. No additional devices outside the PC housing will be required. The chip card fitted with a transceiver component for IR data transmission remains easily replaceable as a complete module, in particular when compared to fixed installation in a PC housing.

Moreover, by integrating the transceiver component into the connector, it is possible to retain all the standards in PCMCIA cards.

Production of such a chip card can be automated using known technologies, and, by retaining almost all design dimensions on the inside and outside of the chip card, such production can be carried out on existing machines and plant.

In addition, the chip card allows versatile adaptation by means of its intentionally selected modular structure and a standardised connection level.

BRIEF DESCRIPTION OF THE DRAWINGS

The invention is to be further explained below using embodiments and the illustrations provided by the figures.

These illustrate.

DESCRIPTION OF THE PREFERRED EMBODIMENTS

Figure 1:
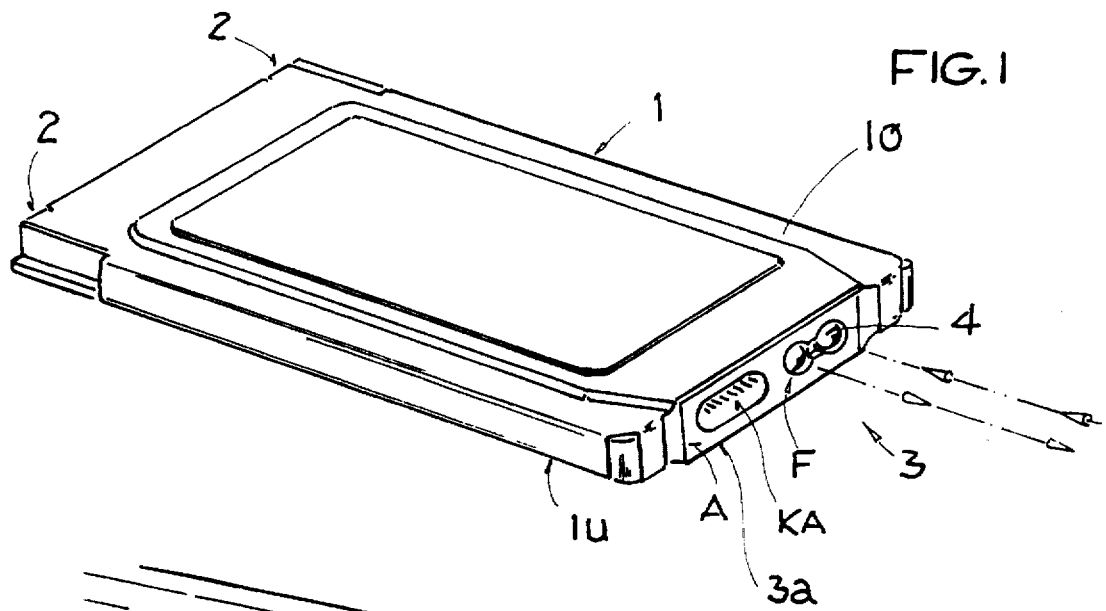
FIG. 1 Chip card complete with transceiver component for IR data transmission

FIG. 1 shows a chip card featuring a housing 1 comprised of top side and underside ($1o,1u$), an internal connector 2, which connects the chip card to the computer, and an external connector 3 provided with an external function surface A, into which the electro-mechanical contact elements KA as well as a window F for IR data transmission have been integrated. The external electro-mechanical contact elements KA are used for connecting peripheral devices equipped with conventional connectors, and the window F is used for IR data transmission by means of the transceiver component 4 located immediately behind the window. The design layout of contact elements KA and window F can be specifically adapted to requirements. In particular, the use of several contact elements KA is conceivable, which may then be arranged to the right or left of window F. It is necessary to ensure only that the course of the rays with respect of transceiver component 4, as indicated in FIG. 1, is not obstructed by external connectors or their connection lines. The chip card will be introduced into the PC such that the function surface A terminates on one level with the PC housing, as is standard for chip cards, and, in particular, PCMCIA cards.

Figure 2:
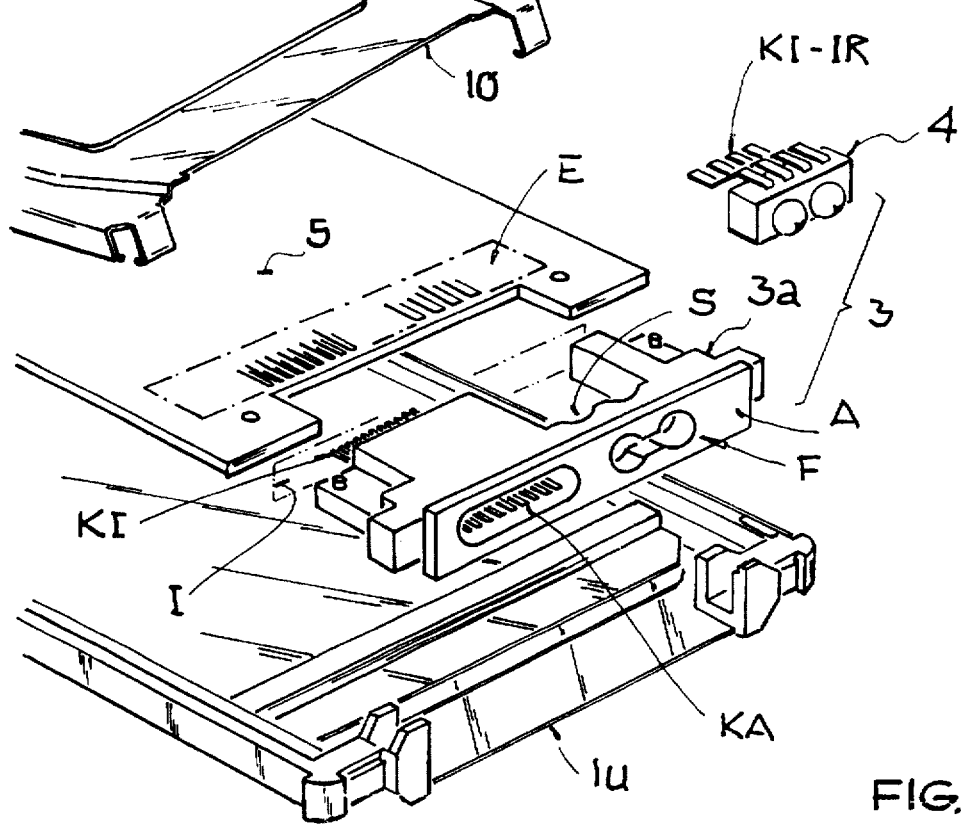
FIG. 2 Open chip card according to PCMCIA standard with external connector complete with transceiver component for IR data transmission in modular design and appropriate function and contact levels

FIG. 2 illustrates a chip card according to the PCMCIA standard. The housing 1 has been opened into top side $1o$ and underside $1u$, which can be closed by means of hooks in the top side $1o$. On the inside of the PCMCIA card, the external connector 3 is shown in modular design. This features—as described above—external contact elements KA, which are electrically connected with internal contact elements KI used for contacting with printed circuit board 5 at contact level E. For the transceiver component 4 for IR data transmission, a recess S is provided, into which this transceiver locks as a precise fit. The internal contact elements of the transceiver component KI-IR are aligned such that they are directed to contacting level E, analogous to the conventional contact elements KI. The constructive layout of connector body $3a$ is predefined by the PCMCIA only with regard to its external dimensions; special pick-ups for transceiver component 4 such as a rail into which component 4 can be locked, possibly with the contact elements KI-IR—which could then be desired as spring contacts—, are conceivable. Externally, connector 3 and connector body $3a$ is defined by the PCMCIA and features construction elements which anchor connector 3 to underside $1u$, such that they may be subjected to a mechanical load, and which provide a mechanical interconnection between connector 3 and a printed circuit board 5. The specific design of the internal function surface I—consisting of contact elements KI and KI-IR—, in particular, the arrangement relative to printed circuit board 5, is freely adaptable. This defines a standardised termination level E, providing advantages for automated production, as a host of easily automated contacting processes are available for contacting the internal contact elements KI of the connector, and the contact elements KI-IR of transceiver component 4 for IR data transmission; and level E can either be located on the top or undersides of the printed circuit board, as PCB and connector only need to be rotated through 180°, and then the connection can be made in an analogous way.

In FIG. 2, the embodiment was selected such that the internal contact elements KI and KI-IR on contacting level E of printed circuit board 5 can be implemented together and in one operation by means of a preferred connection technology of connector and printed circuit board, and a soldering process based on SMT (surface mount technology), as these can be easily interconnected by soldering the components onto the printed circuit board (mostly SMT components) and are technologically well controlled.

If, during automatic assembly, suction tools are to be used for populating the printed circuit board, transceiver component 4 may be fitted into recess S with its flat surface pointing upwards, at the same time allowing an appropriate adaptation to be made to level E for connection to printed circuit board 5.

The embodiment of window F can either be implemented in an open version, or covered by IR-transparent material. The first option provides lower damping, the second option affords protection against dirt and humidity and facilitates cleaning.

For a full implementation of the principle of wireless data transmission by means of IR data transmission, the chip card may be used without external contact elements KA. In addition to the modular design of connector 3, subdivided into connector body 3a, internal and external contact elements KA, KI, and KI-IR, as well as transceiver component 4 for IR data transmission, the connector can also be implemented as a single unit by means of a moulding compound, which will either be cast or moulded and harden into connector body 3a, and thus be embodied as a single component.

What is claimed is:

1. A chip card including a housing comprised of top side and underside, an internal connector for connecting the card to a port of a computer, an external connector for connecting peripheral devices to the card, with the external connector consisting of a connector body which locks into the top side and underside of the chip card and which has an external function surface complete with external contact elements for connection to peripheral devices and an internal function surface provided with internal contact elements for connection to a printed current board within the housing, and an infrared transceiver component for optical data transmission, with the infrared transceiver component being disposed within the housing and integrated into the external connector so that it extends to a window in the external function surface and is connected to the circuit board via internal contact elements.

2. A chip card according to claim 1 wherein the internal contact elements of the internal function surface, including the contact contacts connected to the IR transceiver component for IR data transmission, are arranged on one termination level in parallel to the printed circuit board such that the PCB is in contact with these elements.

3. A chip card according to claim 1 wherein the card is a PCMCIA card.

4. A chip card according to claim 2 wherein the internal contact elements are interconnected with the printed circuit board by means of plug-in connections.

5. A chip card according to claim 2 wherein internal the contact elements are spring contact elements.

6. A chip according to claim 2 wherein the internal contact elements are soldered onto the printed circuit board by means of surface mount technology (SMT).

7. In a process for manufacturing a chip card according to claim 4, the improvement comprising locking the infrared transceiver component into the connector body before soldering the external chip card connector onto the printed circuit board.

8. In a process for manufacturing a chip card according to claim 4, the improvement comprising casting or molding the external chip card connector, together with the contact elements and the IR transceiver component, using a connector body compound and in one operation, to form a single assembly, and then connecting the single assembly to the printed circuit board.

9. A chip card according to claim 6 wherein the window is one of an open window and a window covered by IR-transparent material.

10. A chip card according to claim 6 wherein the IR-transceiver component is disposed in a recess provided in the connector body of the external connector with the recess being of a size such that the transceiver component is held in the recess of the connector body in tight fit and the contact elements of the IR transceiver component end on the termination level.

11. A PCMCIA chip card including an infrared transceiver component for optical data transmission inside a housing consisting of top side and underside and an internal chip connector, wherein the chip card is provided with a termination part comprising a connector body locking into the top side and underside of the chip card, and into which termination part the infrared transceiver component for optical data transmission is integrated.

* * * * *